(12) United States Patent
Weng et al.

(10) Patent No.: US 9,837,282 B1
(45) Date of Patent: Dec. 5, 2017

(54) SEMICONDUCTOR STRUCTURE

(71) Applicant: UNITED MICROELECTRONICS CORP., Hsin-Chu (TW)

(72) Inventors: Tang-Chun Weng, Chiayi (TW); Chia-Ching Lin, Kaohsiung (TW); Yen-Pu Chen, Tainan (TW); En-Chiuan Liou, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/667,641

(22) Filed: Aug. 3, 2017

Related U.S. Application Data

(63) Continuation of application No. 15/365,967, filed on Dec. 1, 2016.

(51) Int. Cl.
| | |
|---|---|
| *H01L 21/02* | (2006.01) |
| *H01L 21/308* | (2006.01) |
| *H01L 21/66* | (2006.01) |
| *H01L 21/762* | (2006.01) |
| *H01L 29/66* | (2006.01) |

(52) U.S. Cl.
CPC ...... *H01L 21/3088* (2013.01); *H01L 21/3081* (2013.01); *H01L 21/76224* (2013.01); *H01L 22/12* (2013.01); *H01L 29/66545* (2013.01); *H01L 29/66795* (2013.01)

(58) Field of Classification Search
CPC ....... H01L 21/30604; H01L 21/823431; H01L 21/823481; H01L 27/0886; H01L 29/0653
See application file for complete search history.

(56) References Cited

U.S. PATENT DOCUMENTS

| | | | |
|---|---|---|---|
| 8,846,490 B1 * | 9/2014 | Shieh | H01L 29/06 257/499 |
| 9,607,985 B1 * | 3/2017 | Tseng | H01L 27/0886 |
| 9,640,633 B1 * | 5/2017 | Greene | H01L 29/66545 |
| 2016/0155739 A1 * | 6/2016 | Ting | H01L 29/0653 257/401 |
| 2017/0047244 A1 * | 2/2017 | Huang | H01L 21/82343 |
| 2017/0092643 A1 * | 3/2017 | Tseng | H01L 27/0886 |

* cited by examiner

*Primary Examiner* — Jaehwan Oh
(74) *Attorney, Agent, or Firm* — Winston Hsu

(57) ABSTRACT

A semiconductor structure includes a semiconductor substrate with a first region and a second region defined thereon. The first region is disposed adjoining the second region in a first direction. The semiconductor substrate includes fin structures, first recessed fins, and a bump. The fin structures are disposed in the first region. Each fin structure is elongated in the first direction. The first recessed fins are disposed in the second region. Each first recessed fin is elongated in the first direction. A topmost surface of each first recessed fin is lower than a topmost surface of each fin structure. The bump is disposed in the second region and disposed between two adjacent recessed fins in the first direction. A topmost surface of the bump is higher than the topmost surface of each first recessed fin and lower than the topmost surface of each fin structure.

12 Claims, 19 Drawing Sheets

SEMICONDUCTOR STRUCTURE

CROSS REFERENCE TO RELATED APPLICATIONS

This application is a continuation of application Ser. No. 15/365,967 filed on Dec. 1, 2016, entitled "METHOD OF FABRICATING SEMICONDUCTOR STRUCTURE", and the entire content of which is hereby incorporated by reference.

BACKGROUND OF THE INVENTION

1. Field of the Invention

The present invention relates to a semiconductor structure and a method of fabricating the same, and more particularly, to a semiconductor structure and a method of fabricating the semiconductor structure for improving the critical dimension uniformity.

2. Description of the Prior Art

In semiconductor manufacturing processes, in order to transfer an integrated circuit onto a semiconductor wafer, the integrated circuits from a database are first designed as a layout pattern and a photomask is then manufactured according to the layout pattern. Patterns on the photomask may then be able to be transferred to the semiconductor wafer. The steps mentioned above may be regarded as a photolithographic process. The photolithographic processes includes many steps, such as a thin film deposition process, a photoresist coating process, an exposure and develop process, and an etching process. The critical dimension (CD) control of the pattern formed by the photolithographic process mentioned above is very important because the layout pattern has to be extremely accurate for forming delicate integrated circuits so as to align with the patterns of the previous and following steps. There are many causes of CD deviations, and etching uniformity of the etching process should be an important one. The etching uniformity may be influenced by many factors, such as etchant condition, layout pattern, and loading effect. Accordingly, the etching process and/or the layout design have to be modified for improving the etching uniformity and the CD control of the semiconductor structure.

SUMMARY OF THE INVENTION

It is one of the objectives of the present invention to provide a semiconductor structure and a method of fabricating the same. In the method of fabricating the semiconductor structure, a fin cut mask used in a fin cut process includes a compensation pattern corresponding to a region where fin structures are removed by a fin remove process, and a fin bump is formed corresponding to the compensation pattern after the fin cut process and the fin remove process. The compensation pattern may be used to improve etching uniformity of the fin cut process, and the critical dimension control of the semiconductor structure may be enhanced accordingly.

A method of forming a semiconductor structure is provided in an embodiment of the present invention. The method includes the following steps. A semiconductor substrate including a plurality of fin structures is provided. Each of the fin structures is elongated in a first direction, and each of the fin structures is partly located in a first region and partly located in a second region adjoining the first region. A fin remove process is performed for removing the fin structures in the second region. A fin cut process is performed with a fin cut mask for cutting at least a part of the fin structures in the first region. The fin cut mask includes a plurality of cut patterns corresponding to a part of the fin structures in the first region and a compensation pattern corresponding to the second region of the semiconductor substrate. A fin bump is formed in the second region and corresponding to the compensation pattern after the fin cut process and the fin remove process.

A semiconductor structure is provided in an embodiment of the present invention. The semiconductor structure includes a semiconductor substrate with a first region and a second region defined thereon. The first region is disposed adjoining the second region in a first direction. The semiconductor substrate includes fin structures, first recessed fins, and a bump. The fin structures are disposed in the first region, and each of the fin structures is elongated in the first direction. The first recessed fins are disposed in the second region. Each of the first recessed fins is elongated in the first direction, and a topmost surface of each of the first recessed fins is lower than a topmost surface of each of the fin structures. The bump is disposed in the second region and disposed between two adjacent recessed fins in the first direction. A topmost surface of the bump is higher than the topmost surface of each of the first recessed fins and lower than the topmost surface of each of the fin structures.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-15 are schematic drawings illustrating a method of fabricating a semiconductor structure according to a first embodiment of the present invention, wherein FIG. 1 is a flow chart of the method of fabricating the semiconductor structure in this embodiment, FIG. 3 is a schematic drawing in a step subsequent to FIG. 2, FIG. 4 is a cross-sectional diagram taken along a line A-A' in FIG. 3, FIG. 5 is a schematic drawing in a step subsequent to FIG. 3, FIG. 6 is a cross-sectional diagram taken along a line B-B' in FIG. 5, FIG. 7 is a schematic drawing illustrating a fin cut mask in this embodiment, FIG. 8 is a schematic drawing in a step subsequent to FIG. 5, FIG. 9 is a cross-sectional diagram taken along a line C-C' in FIG. 8, FIG. 10 is a flow chart of a process of forming a fin cut mask in this embodiment, FIG. 11 is a schematic drawing illustrating a fin cut layout pattern in this embodiment, FIG. 12 is a schematic drawing illustrating a corrected layout pattern in this embodiment, FIG. 13 is a schematic drawing in a step subsequent to FIG. 8, FIG. 14 is a cross-sectional diagram taken along a line D-D' in FIG. 13, and FIG. 15 is a schematic drawing in a step subsequent to FIG. 14.

FIG. 16 and FIG. 17 are schematic drawings illustrating a method of fabricating a semiconductor structure according to a second embodiment of the present invention, wherein FIG. 16 is a flow chart of the method of fabricating the semiconductor structure in this embodiment.

DETAILED DESCRIPTION

Figure 1:
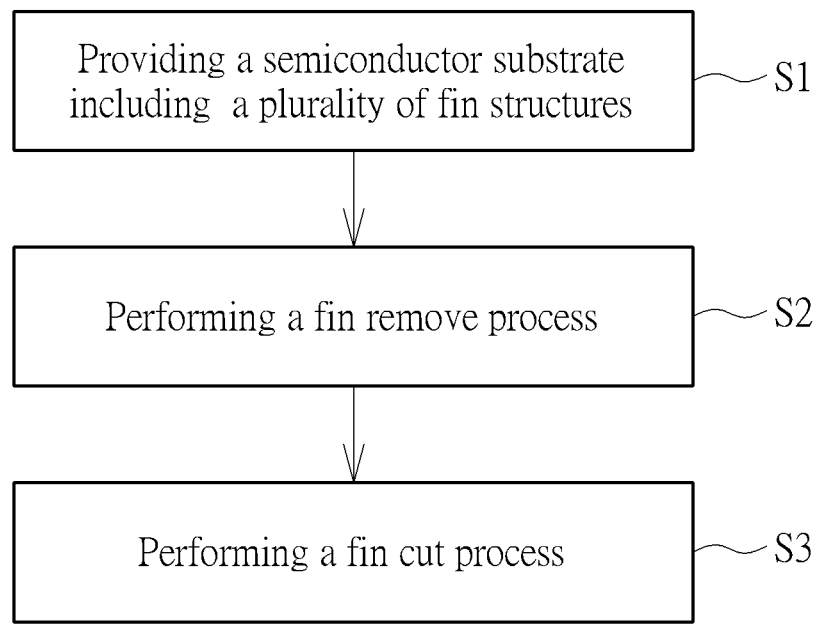
Figure 2:
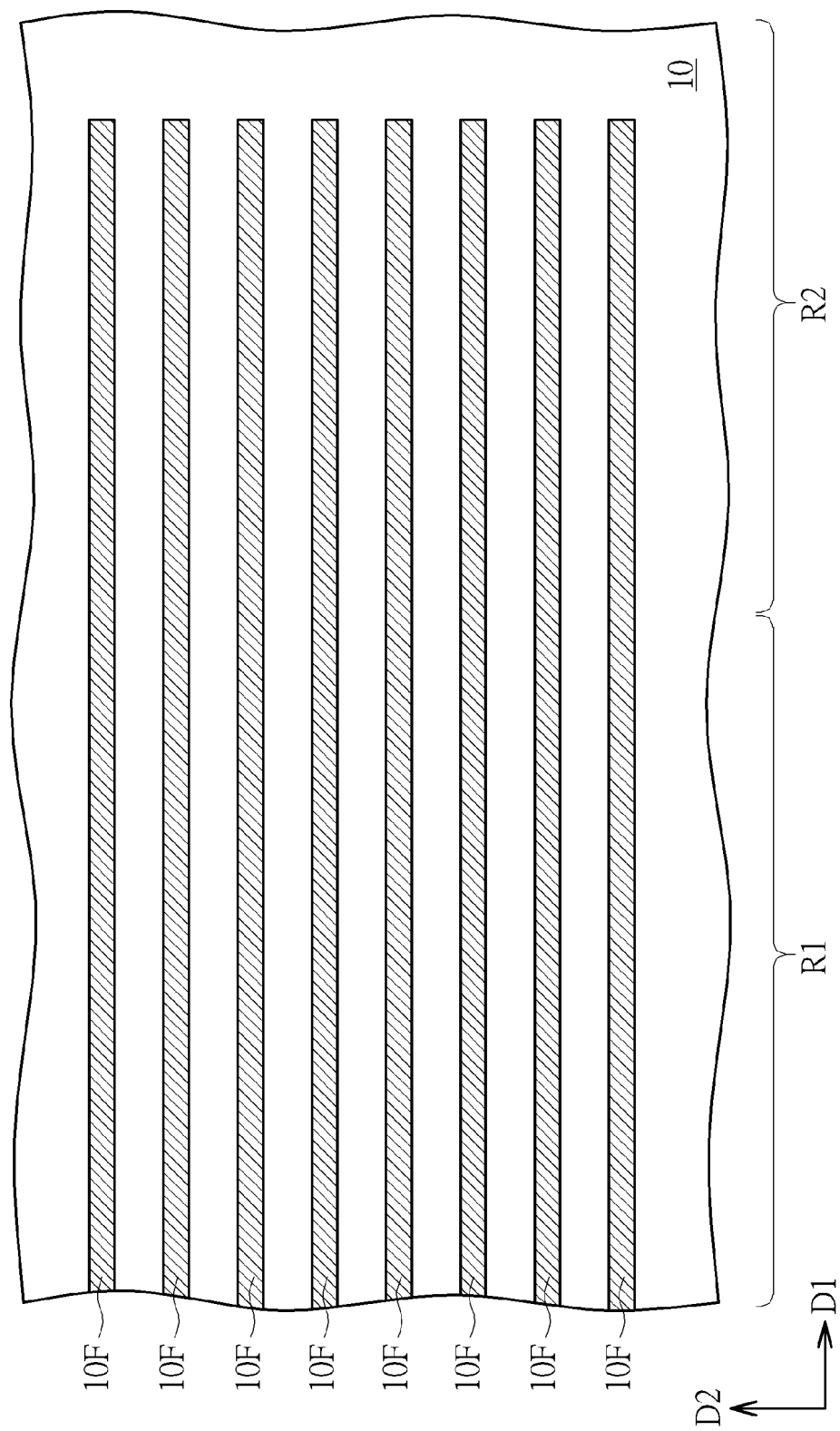

Please refer to FIGS. 1-15. FIGS. 1-15 are schematic drawings illustrating a method of fabricating a semiconductor structure according to a first embodiment of the present invention. The method of fabricating the semiconductor structure in this embodiment includes the following steps. As shown in FIG. 1 and FIG. 2, in step S1, a semiconductor substrate 10 is provided. The semiconductor substrate 10 in this embodiment may include a silicon substrate, an epitaxial silicon substrate, a silicon germanium substrate, a silicon carbide substrate, or a silicon-on-insulator (SOI) substrate, but not limited thereto. The semiconductor substrate 10 includes a plurality of fin structures 10F, and each of the fin structures 10F includes a fin-shaped structure made of semiconductor material. Each of the fin structures 10F is elongated in a first direction D1, and the fin structures 10F are repeatedly disposed in a second direction D2. The first direction D1 may be substantially orthogonal to the second direction D2, but not limited thereto. The fin structures 10F may be formed by performing a patterning process, such as a multiple patterning process, to the semiconductor substrate 10. A first region R1 and a second region R2 are defined on the semiconductor substrate 10. The second region R2 is located adjoining the first region R1. In other words, the first region R1 and the second region R2 may be directly connected with each other. Each of the fin structure s 10F is partly located in the first region R1 of the semiconductor substrate 10 and partly located in the second region R2 of the semiconductor substrate 10. For example, the first region R1 may be disposed adjoining the second region R2 in the first direction D1, each of the fin structures 10F may extend from the first region R1 to the second region R2 along the first direction D1, and one end of each fin structure 10 may be disposed within the second region R2, but not limited thereto.

Figure 3:
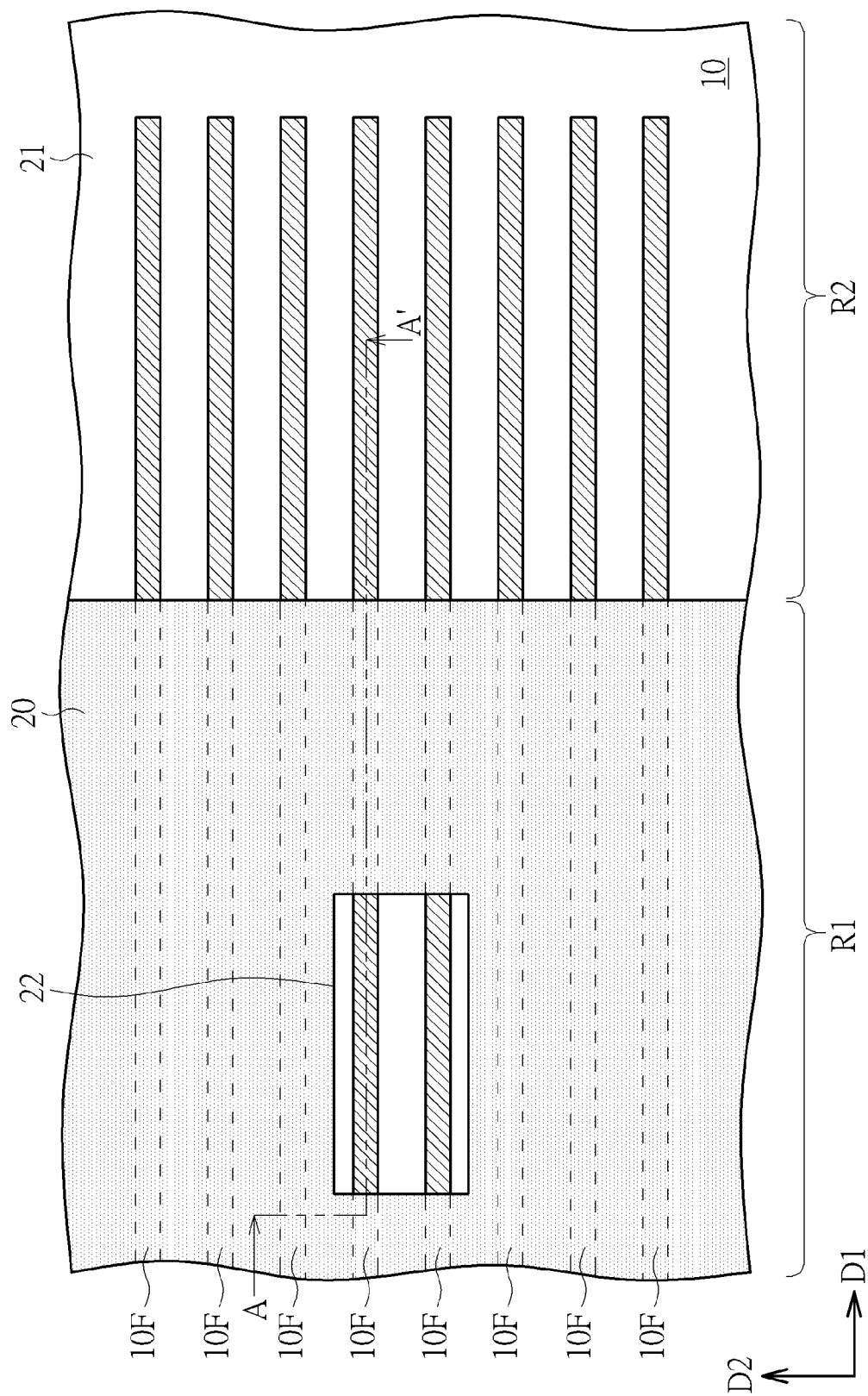
Figure 4:
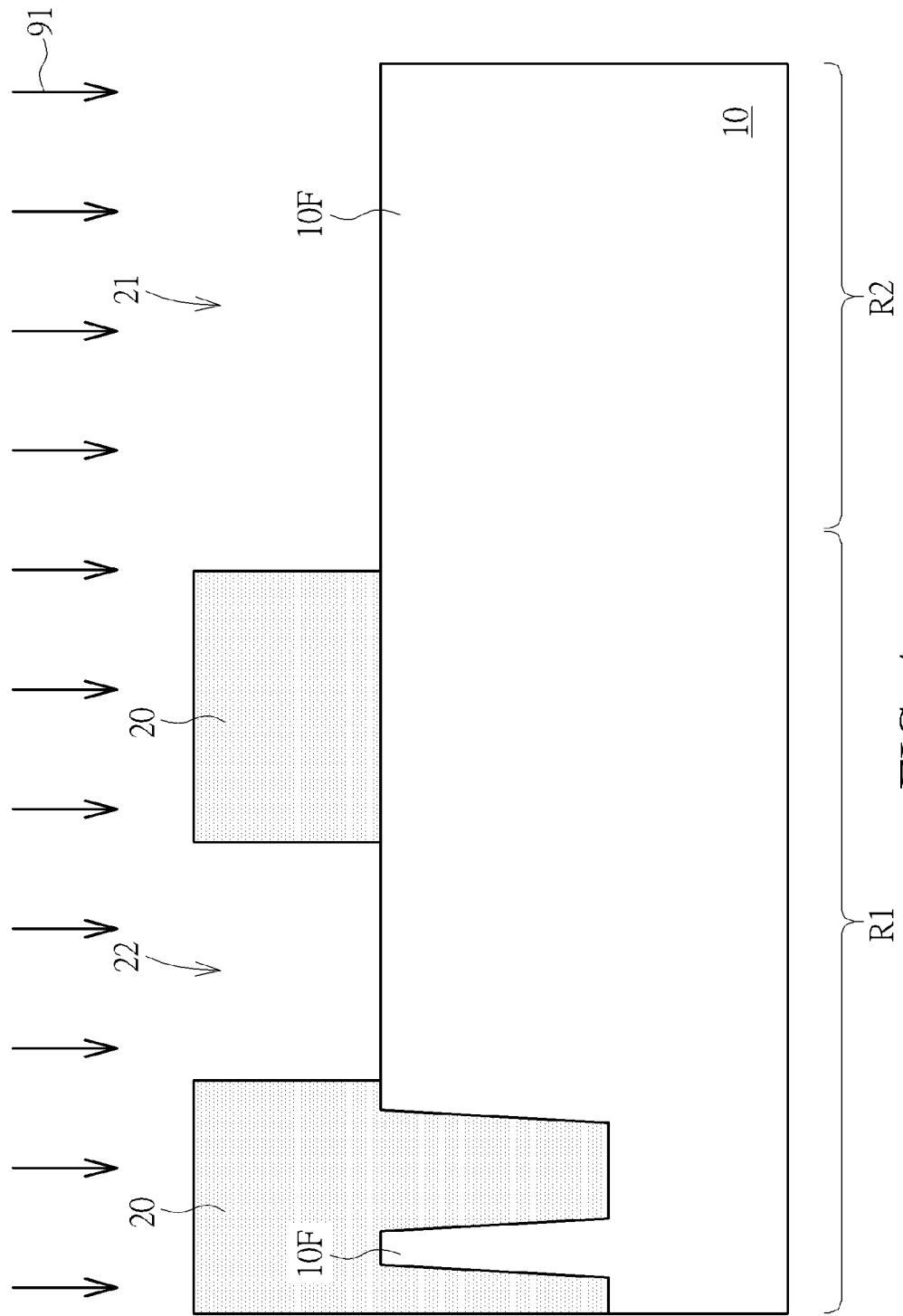
Figure 5:
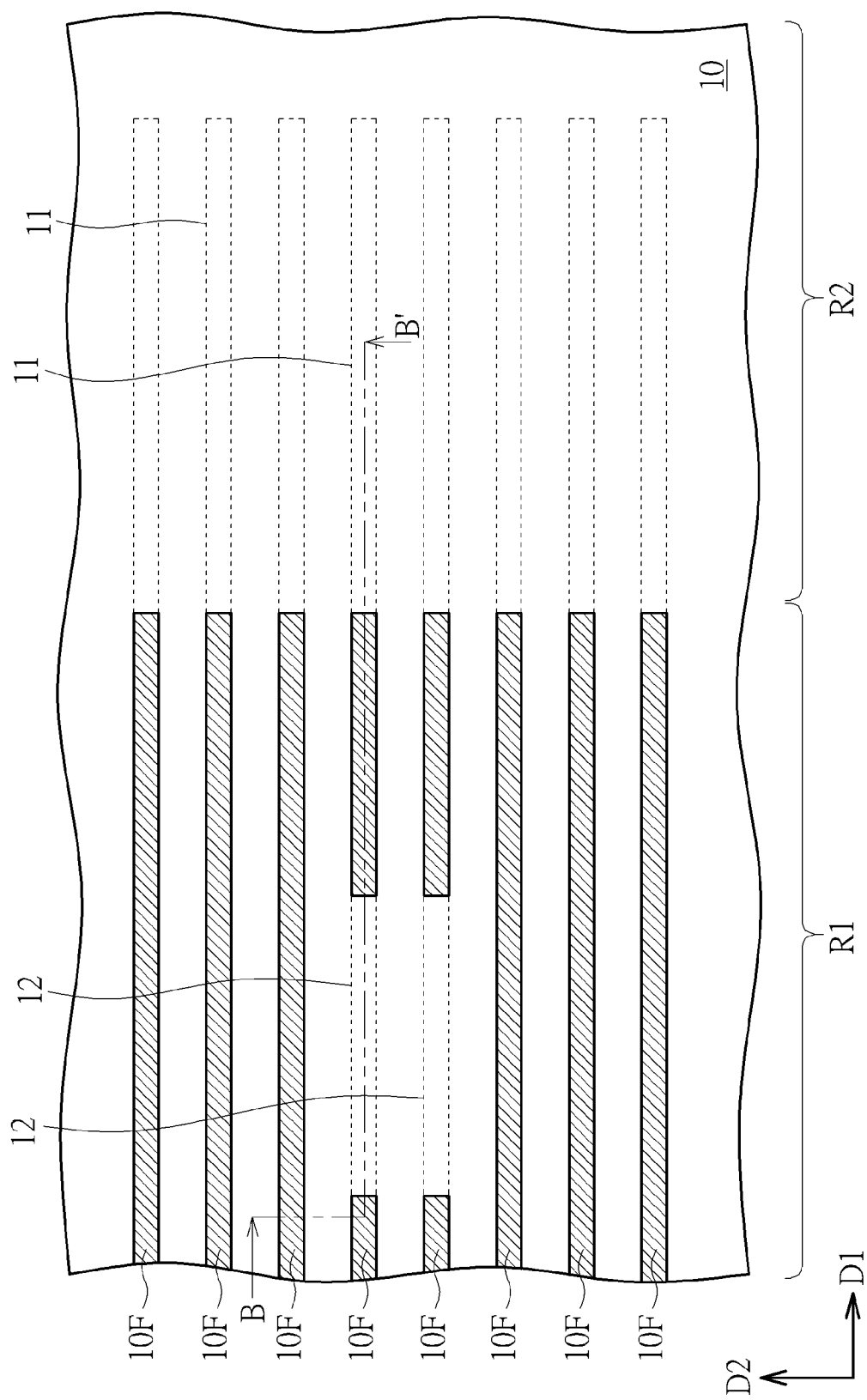
Figure 6:
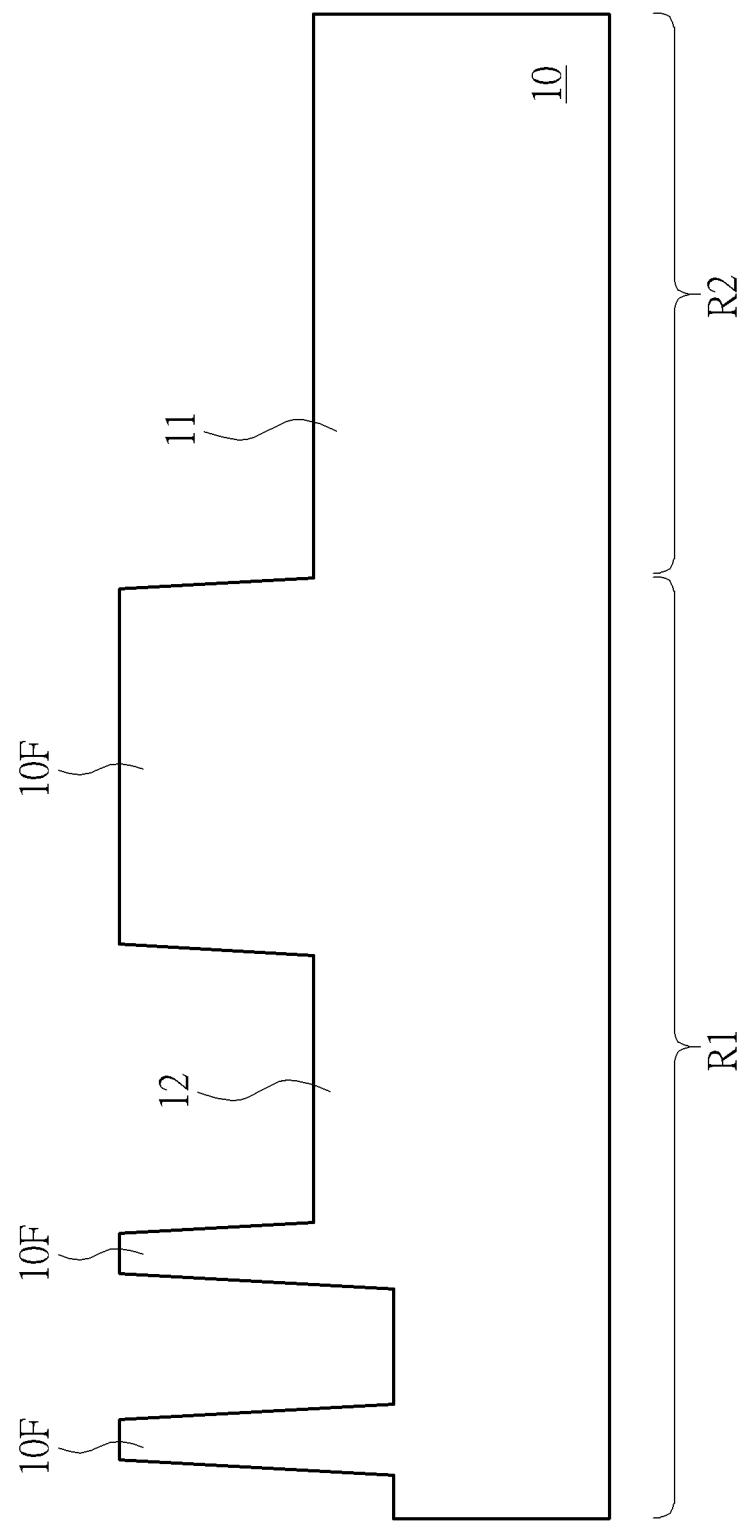

As shown in FIG. 1 and FIGS. 3-6, in step S2, a fin remove process is performed for removing the fin structures 10F in the second region R2. In some embodiments, the fin remove process may include but is not limited to the following steps. As shown in FIG. 3 and FIG. 4, a first patterned mask layer 20 is formed on the semiconductor substrate 10. The first pattern mask layer 20 includes a first opening 21 exposing the fin structures 10F in the second region R2. A first etching process 91 with the first pattern mask layer 20 as a mask is performed for removing the fin structures 10F in the second region R2. Specifically, the fin structures 10F which are not covered by the first pattern mask layer 20 in the first etching process 91 are at least partially removed by the first etching process 91. In some embodiments, the first patterned mask layer 20 may further include a second opening 22 exposing a part of the fin structures 10F in the first region R1, and the second opening 22 may be elongated in the first direction D1, but not limited thereto. As shown in FIGS. 3-6, a plurality of recessed fins may be formed by the fin remove process described above. For example, a plurality of first recessed fins 11 may be formed in the second region R2, and a second recess fin 12 may be formed in the first region R1. Each of the first recessed fins 11 is a residual part of each fin structure 10F in the second region R1 after the first etching process 91, and the second recessed fin 12 is a residual part of one of the fin structures 10F in the first region R1 after the first etching process 91. Therefore, the topmost surface of the first recessed fin 11 and the topmost surface of the second recessed fin 12 are lower than the topmost surface of the fin structure 10F.

Figure 7:
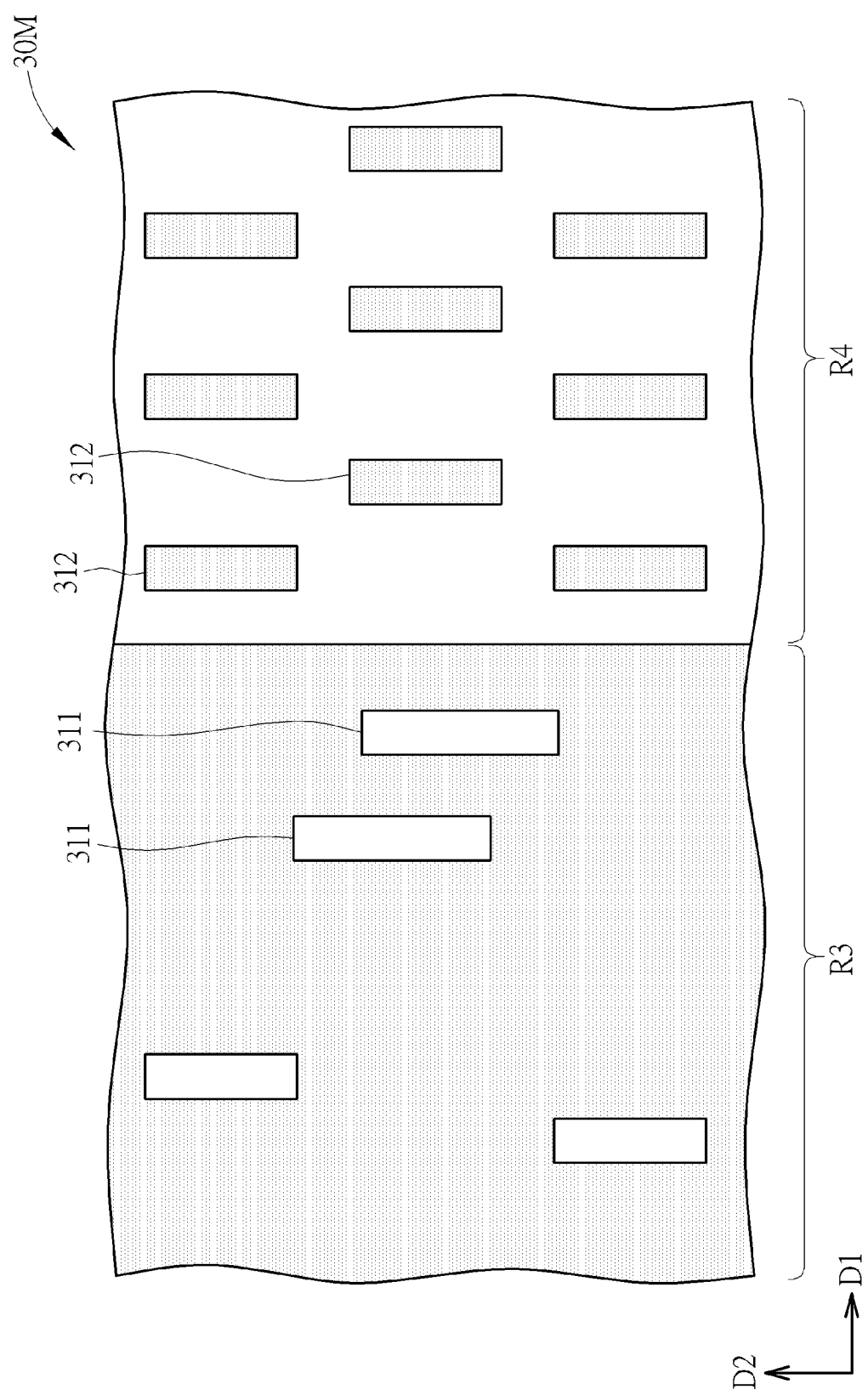
Figure 8:
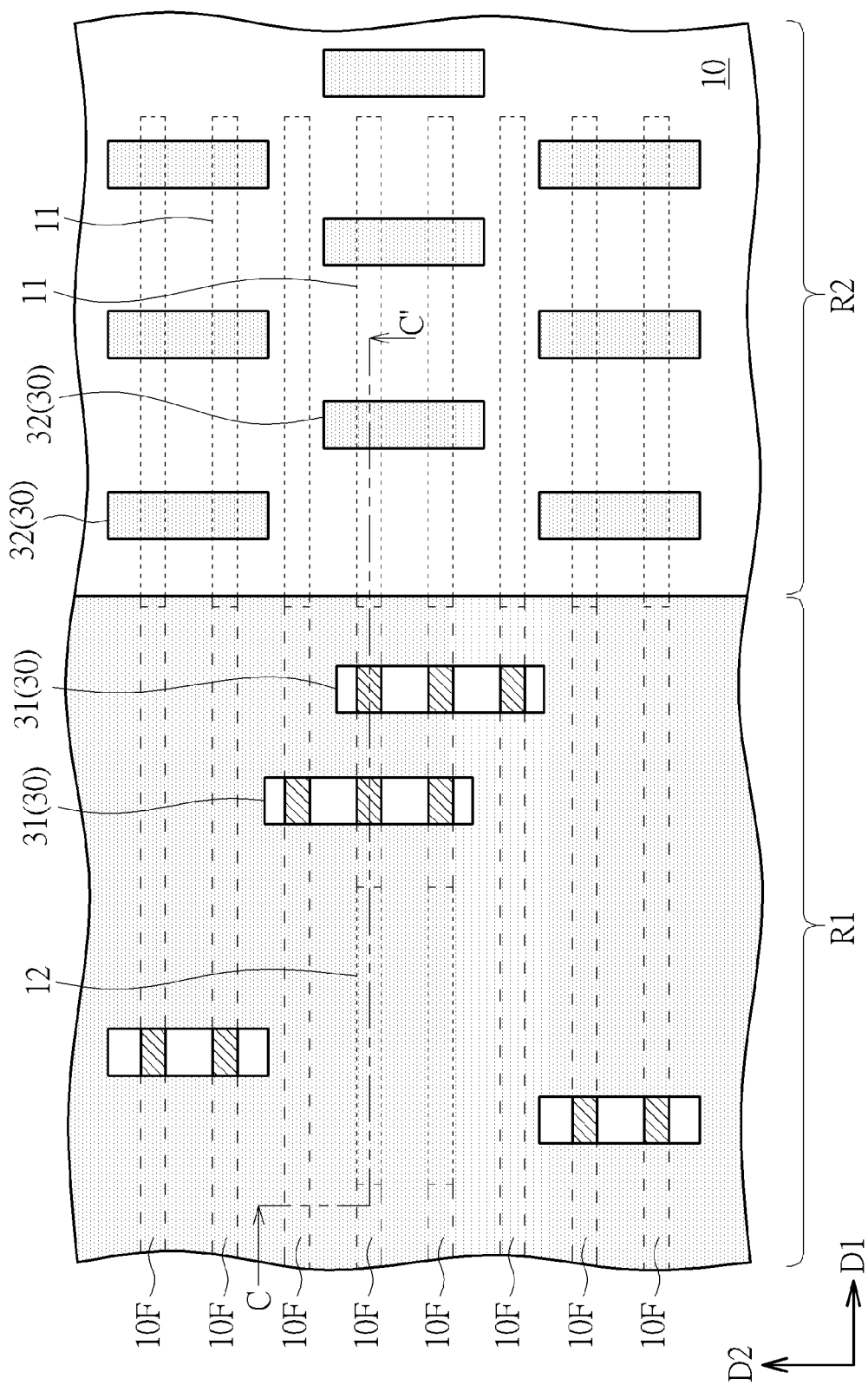
Figure 9:
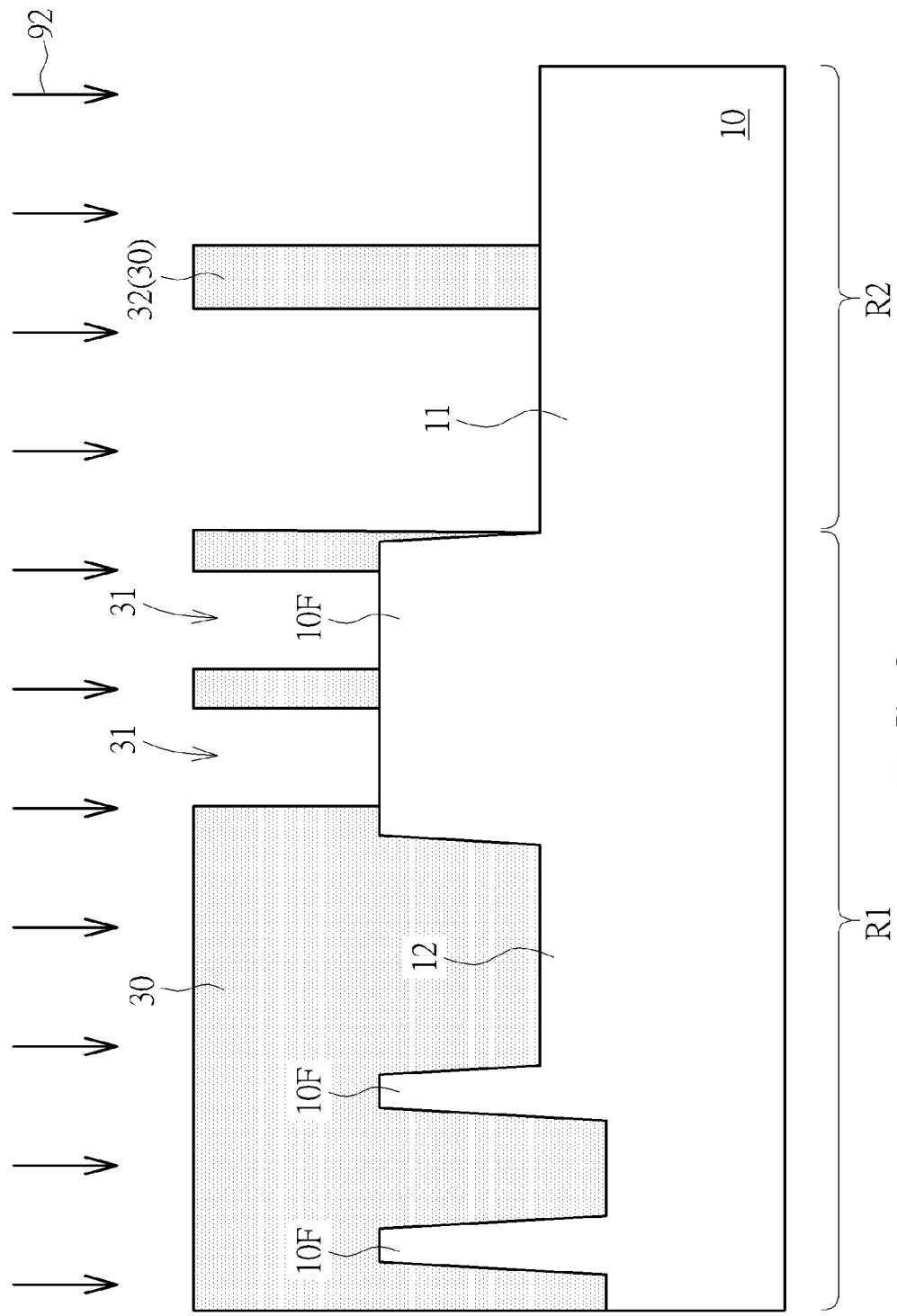
Figure 10:
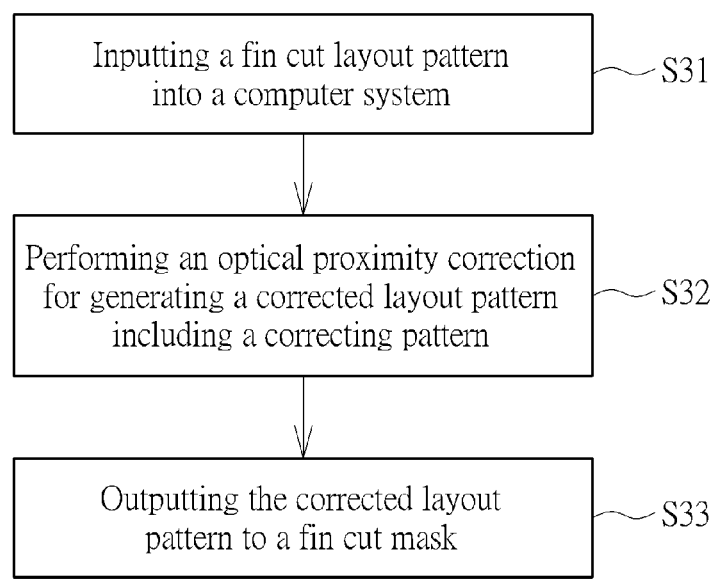
Figure 11:
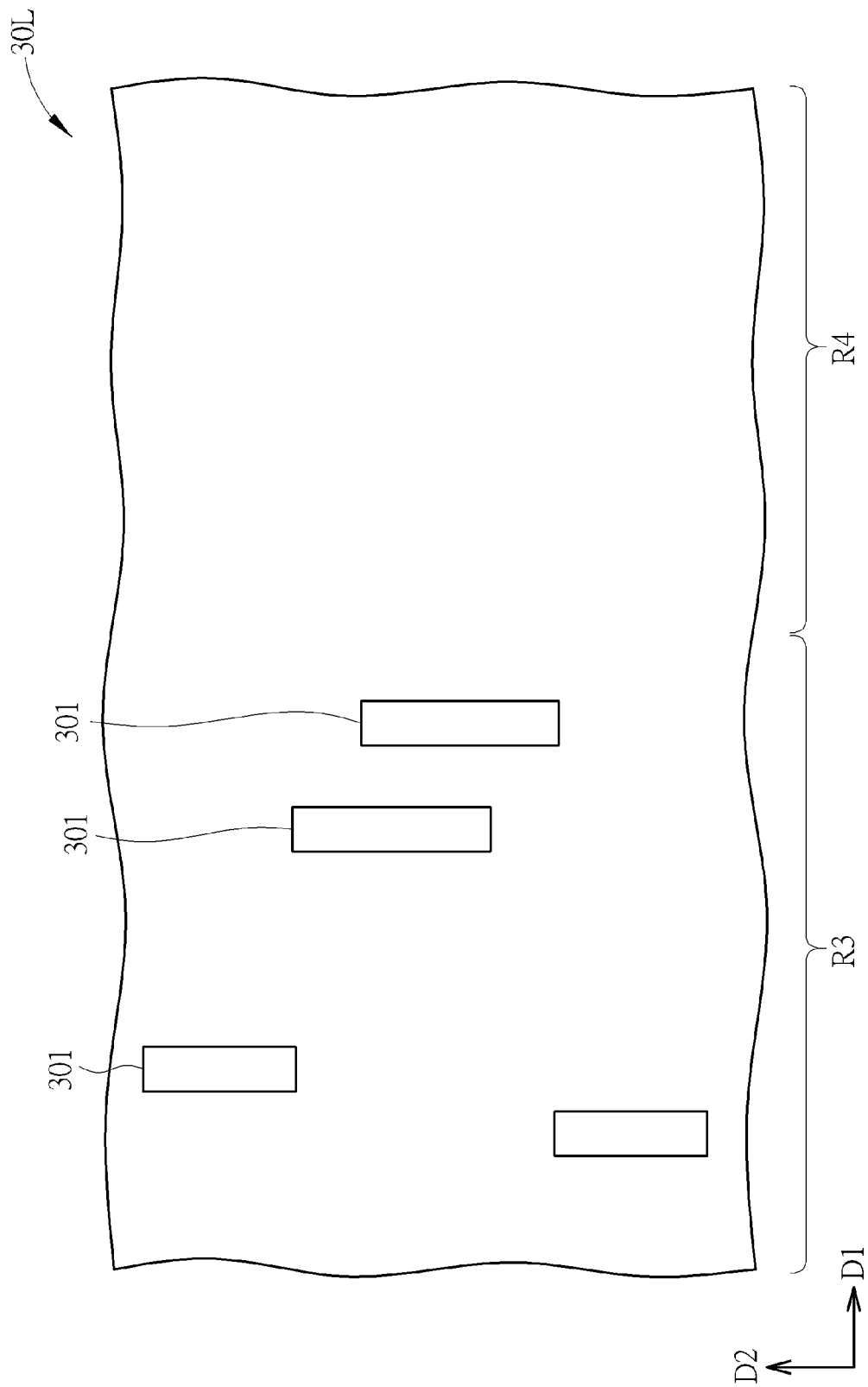
Figure 12:
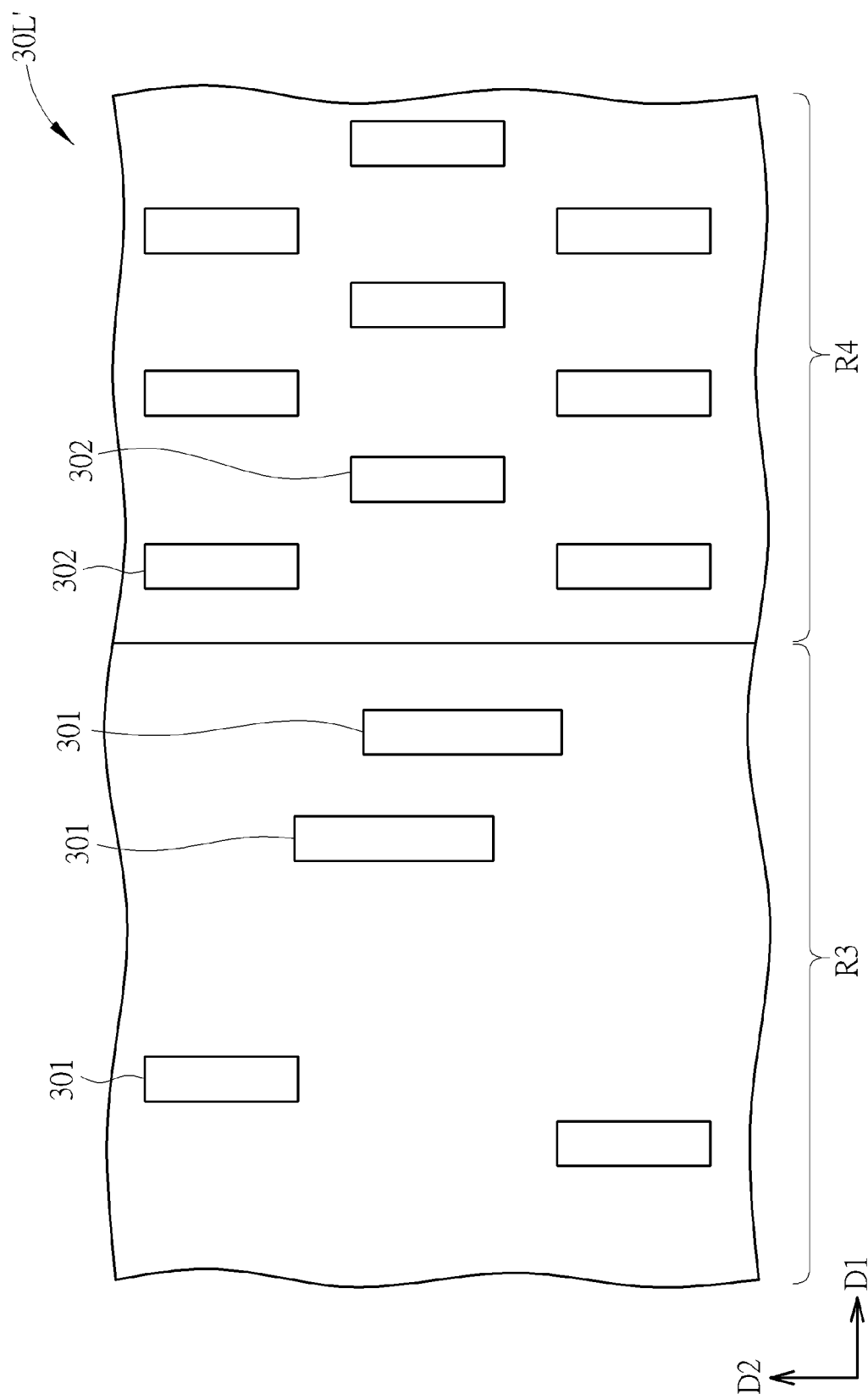
Figure 13:
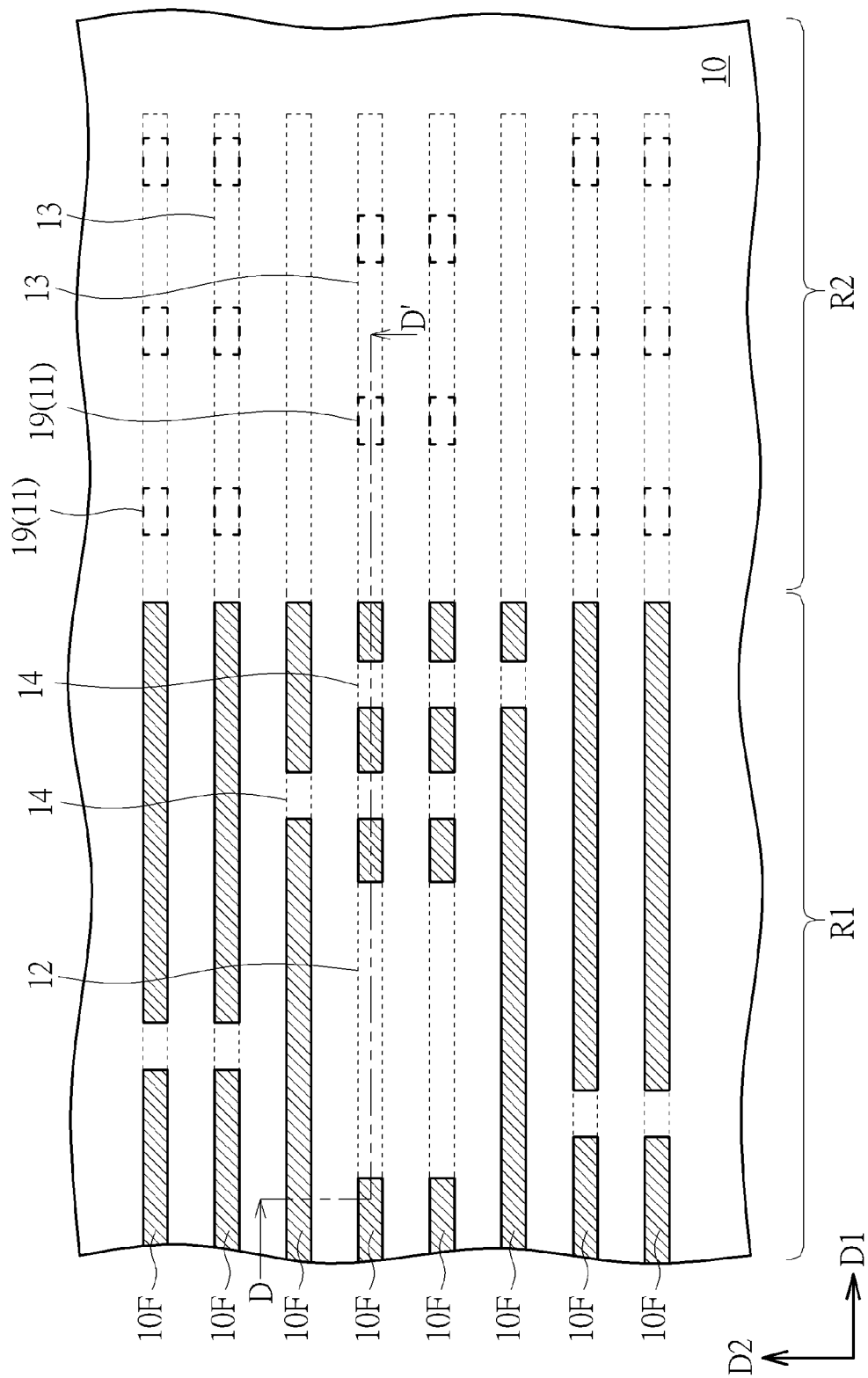
Figure 14:
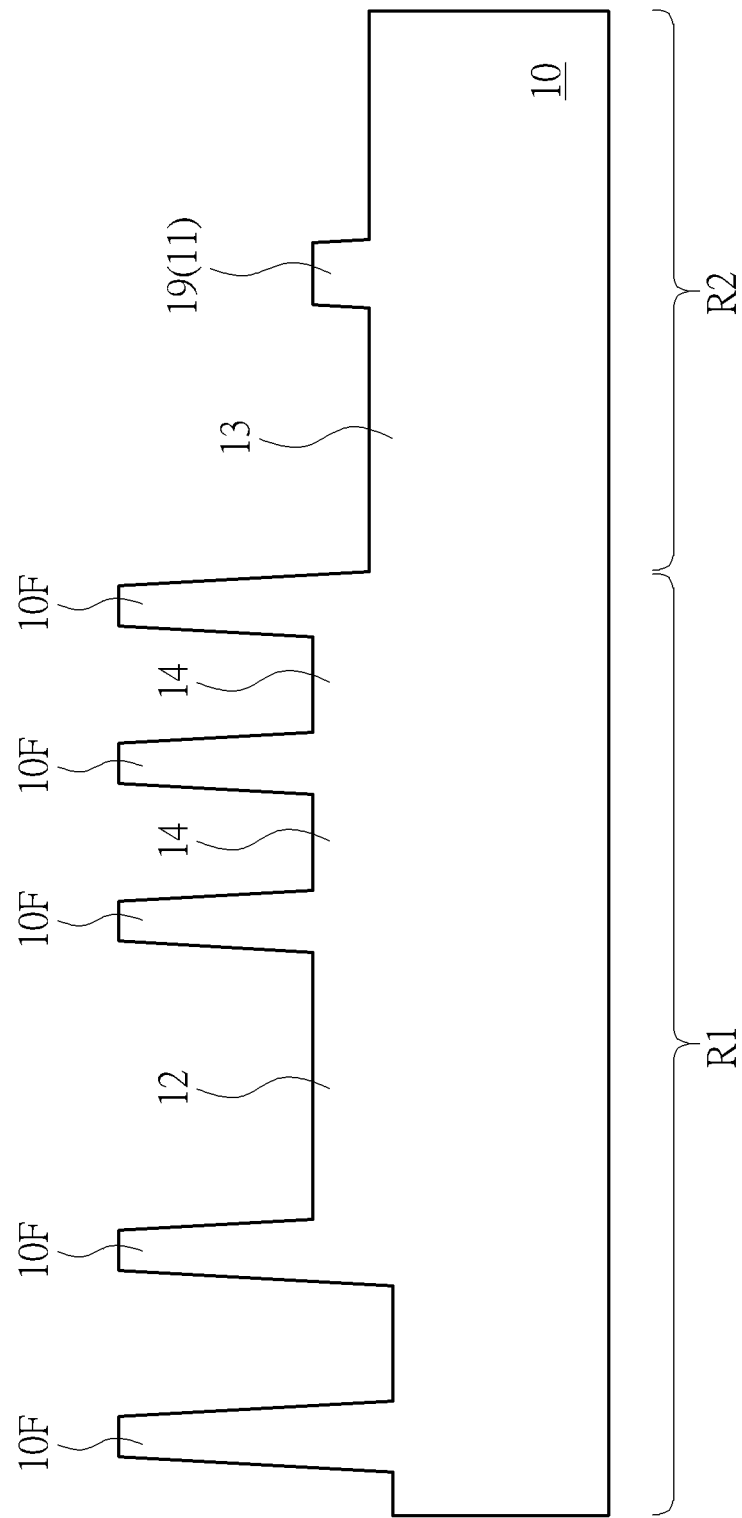

As shown in FIG. 1 and FIGS. 7-14, in step S3, a fin cut process with a fin cut mask 30M is performed for cutting at least a part of the fin structures 10F in the first region R1. Specifically, the fin cut process may include but is not limited to the following steps. As shown in FIGS. 7-9, a second patterned mask layer 30 is formed on the semiconductor substrate 10. The second patterned mask layer 30 is defined by the fin cut mask 30M by such as a photolithographic process. The second mask layer 30 includes a plurality of third openings 31 exposing a part of the fin structures 10F in the first region R1 and at least one dummy pattern 32 in the second region R2. The third openings 31 in the second patterned mask layer 30 is defined by a plurality of cut patterns 311 in the fin cut mask 30M, and the dummy pattern 32 of the second mask layer 30 is defined by a compensation pattern 312 in the fin cut mask 30M. A third region R3 corresponding to the first region R1 of the semiconductor substrate 10 and a fourth region R4 corresponding to the second region R2 of the semiconductor substrate 10 may be defined on the fin cut mask 30M. The fin cut mask 30M includes the cut patterns 311 in the third region R3 and the compensation pattern 312 in the fourth region R4. In other words, the fin cut mask 30M includes the cut patterns 311 corresponding to a part of the fin structures 10F in the first region R1 and the compensation pattern 312 corresponding to the second region R2 of the semiconductor substrate 10. In this embodiment, the fin remove process is performed before the fin cut process, and the dummy pattern 32 may overlap a part of the first recessed fins 11. Additionally, each of the third openings 31 may be elongated in the second direction D2, and the dummy pattern 32 may be elongated in the second direction D2 also, but not limited thereto. The shape of the dummy pattern 32 may be similar to that of the third openings 31 adjacent to the juncture of the first region R1 and the second region R2 preferably for improving the etching loading effect near the juncture of the first region R1 and the second region R2 in a subsequent etching process.

In some embodiments, the process of forming the fin cut mask 30M may include but is not limited to the following steps. As shown in FIGS. 7-8 and FIG. 10-12, in step S31, a fin cut layout pattern 30L is input into a computer system. The fin cut layout pattern 30L includes a plurality of slot patterns 301 in the third region R3 corresponding to the first region R1. In step S32, an optical proximity correction (OPC) to the fin cut layout pattern 30L is performed for generating a corrected layout pattern 30L'. The corrected layout pattern 30L' includes a correcting pattern 302 in the fourth region R4 corresponding to the second region R2. The correcting pattern 302 is generated in accordance with at least one of the slot patterns 301 adjacent to the fourth region R4. In step S33, the corrected layout pattern 30L' is output to the fin cut mask 30M, and the compensation pattern 312 is defined by the correcting pattern 302. In other words, the compensation pattern 312 on the fin cut mask 30M is generated by the optical proximity correction, and the compensation pattern 312 is located in the fourth region R4 corresponding to the second region R2 of the semiconductor substrate 10 where the fin structures 10F are going to be removed.

As shown in FIGS. 7-9 and FIGS. 13-14, a second etching process 92 with the second pattern mask layer 30 as a mask is per formed for cutting a part of the fin structures 10F in the first region R1. The dummy pattern 32 of the second patterned mask layer 30 covers a part of the first recessed fin 11 during the second etching process 92, and a fin bump 19 is formed by the second etching process 92 accordingly. The fin bump 19 is formed by removing a part of the first recessed fins 11 which are not covered by the second patterned mask layer 30 in the second etching process 92. In other words, the fin bump 19 is a part of the first recessed fin 11 covered by the dummy pattern 32 in the second etching process 92 and remains after the second etching process 92. Therefore, the fin bump 11 is formed in the second region R2 and corresponding to the compensation pattern 312 after the fin cut process and the fin remove process. Accordingly, the correcting pattern generated in accordance with the slot pattern by the optical proximity correction is printable on the semiconductor substrate 10. It is worth noting that other correcting patterns may also be generated in accordance with the slot patterns which are not adjacent to the fourth region R4 by the optical proximity correction, and these correcting patterns may be formed in the third region R3 and will not be printable on the semiconductor substrate 10.

In some embodiments, an area of the first recessed fins 11 covered by the dummy pattern 32 is smaller than an area of the first recessed fins 11 which are not covered by the dummy pattern 32 for etching most parts of the first recessed fins 11 in the second etching process, but not limited thereto. Additionally, a plurality of recessed fins may also be formed by the second etching process 92. For example, a plurality of third recessed fins 13 may be formed in the second region R2, and a plurality of fourth recess fins 14 may be formed in the first region R1. Each of the third recessed fins 13 may be a part of the first recessed fin 11 etched by the second etching process 92. Each of the fourth recessed fins 14 may be a part of the fin structure 10F exposed by the third openings 31 and etched by the second etching process 92. Therefore, the topmost surface of the third recessed fin 13 is lower than the topmost surface of the fourth recessed fin 14. In this embodiment, the dummy pattern 32 may be used to improve the etching loading effect near the juncture of the first region R1 and the second region R2 in the second etching process 92, and the critical dimension control of the fin structures 10F near the juncture of the first region R1 and the second region R2 may be improved accordingly.

Figure 15:
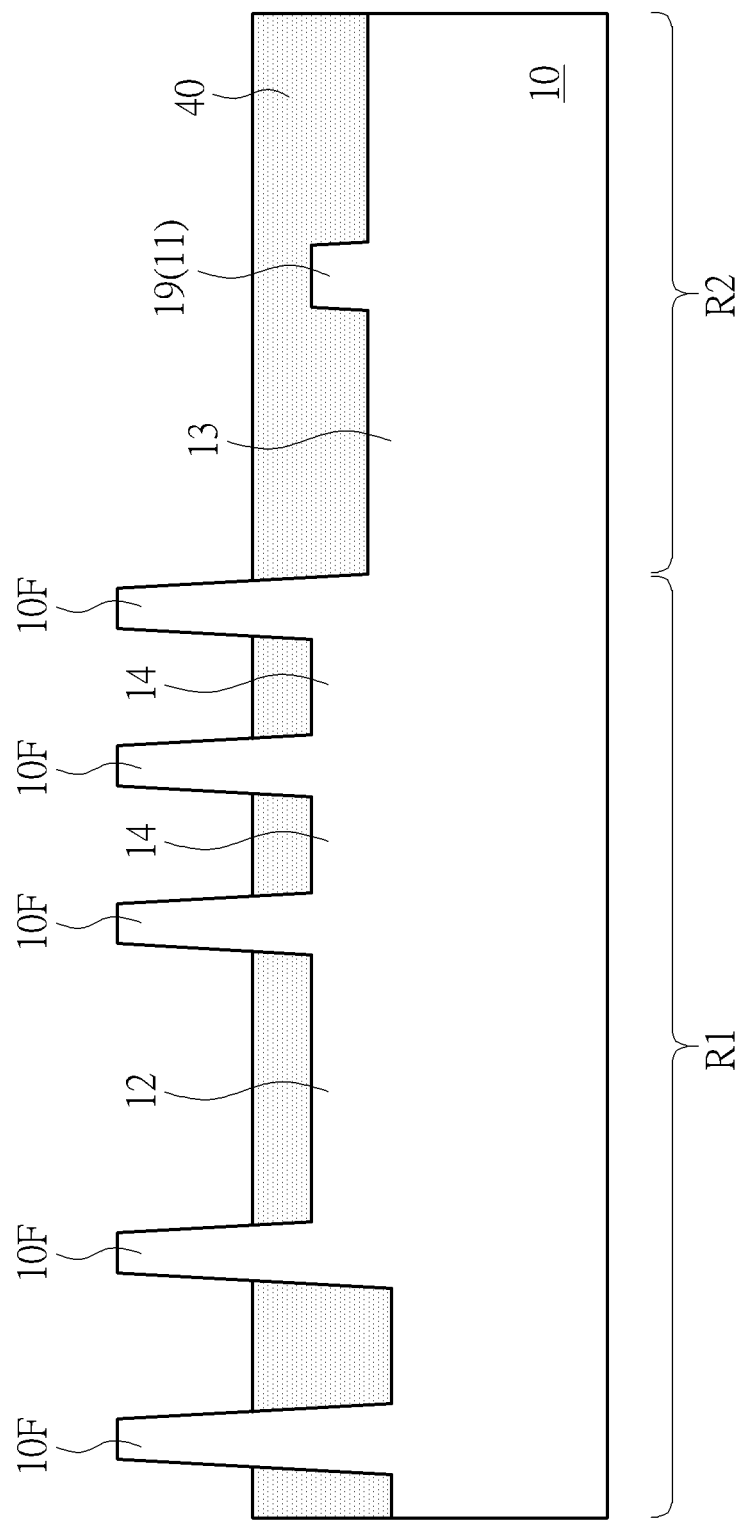

As shown in FIG. 15, a shallow trench isolation (STI) 40 is formed on the semiconductor substrate 10 after the fin remove process and the fin cut process described above. The shallow trench isolation 40 covers the fin bump 19 and the recessed fins, such as the first recess fin 11 in the second region R2 and the second recessed fin 12 in the first region R1. The fin structures 10F with the topmost surface higher than the topmost surfaces of the first recess fin 11, the second recessed fin 12, and the fin bump 19 may protrude above the level of the topmost surface of the shallow trench isolation 40. In other words, other subsequently formed parts, such as gate structures, may be formed directly on the fin structures 10F and may be isolated from the first recess fin 11, the second recessed fin 12, and the fin bump 19 by the shallow trench isolation 40.

Figure 16:
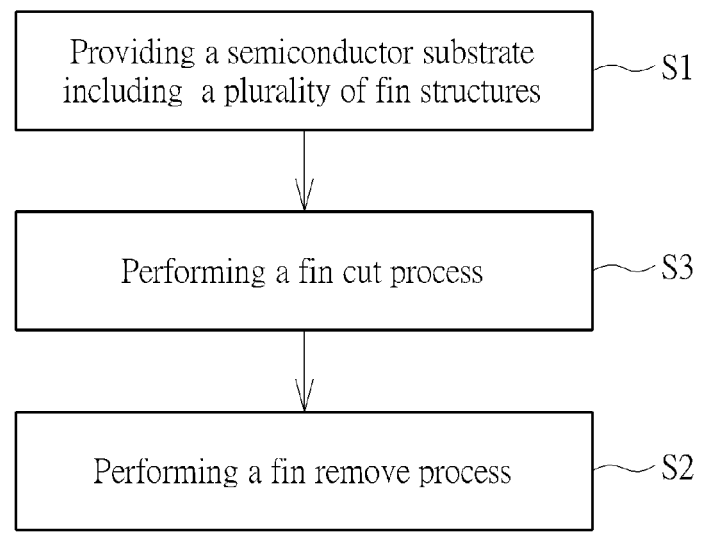
Figure 17:
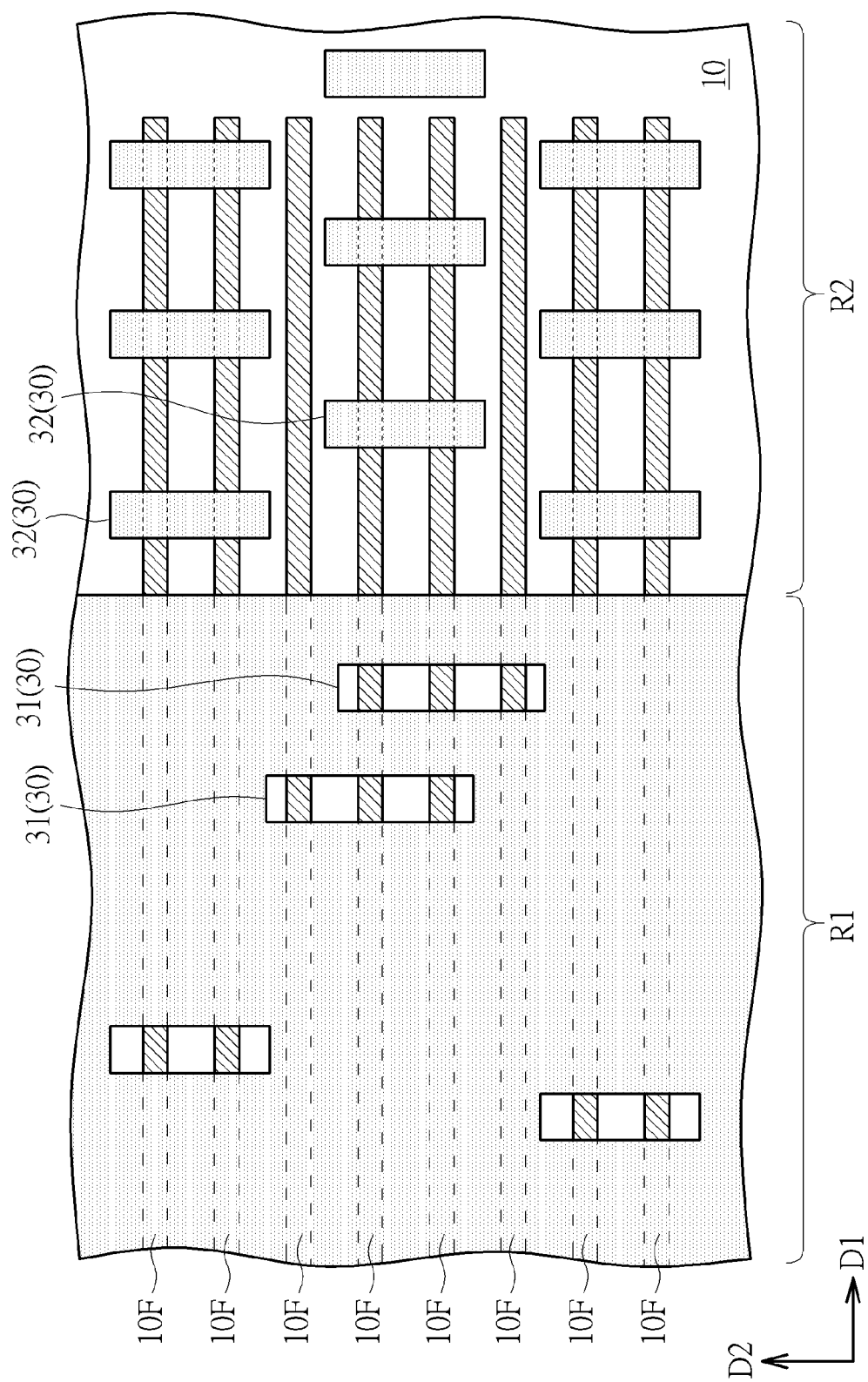

Please refer to FIG. 16 and FIG. 17. FIG. 16 and FIG. 17 are schematic drawings illustrating a method of fabricating a semiconductor structure according to a second embodiment of the present invention. As shown in FIG. 16 and FIG. 17, the difference between the method in this embodiment and the method in the first embodiment is that the fin cut process is performed before the fin remove process in this embodiment. In this embodiment, the dummy pattern 32 of the second patterned mask layer 30 covers a part of the fin structures 10F in the second region R2 during the second etching process. An area of the fin structures 10F covered by the dummy pattern 32 is smaller than an area of the fin structures 10F in the second region R2 without being covered by the dummy pattern 32.

Figure 18:
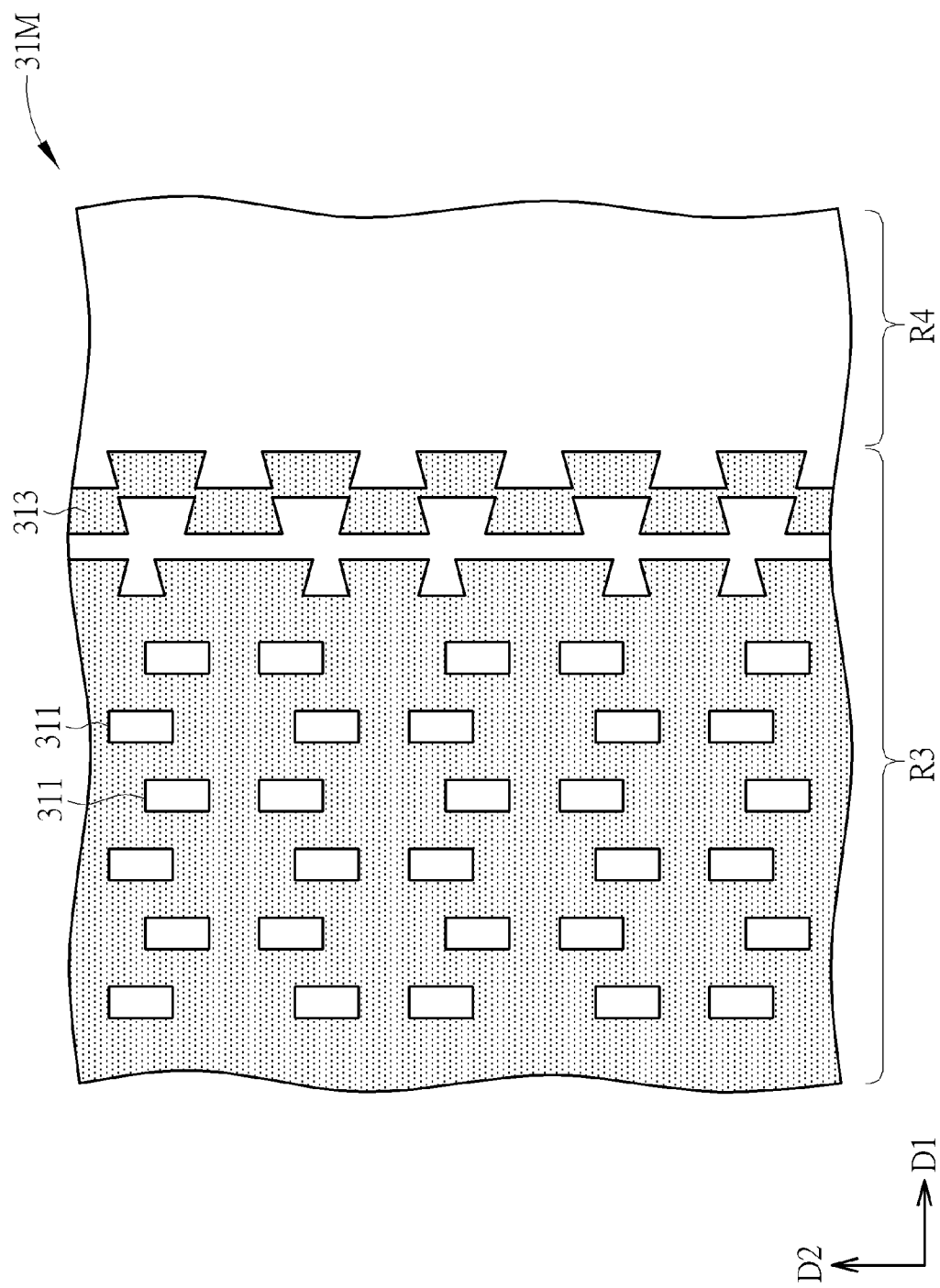
FIG. 18 is a schematic drawing illustrating a fin cut mask according to a third embodiment of the present invention.
Figure 19:
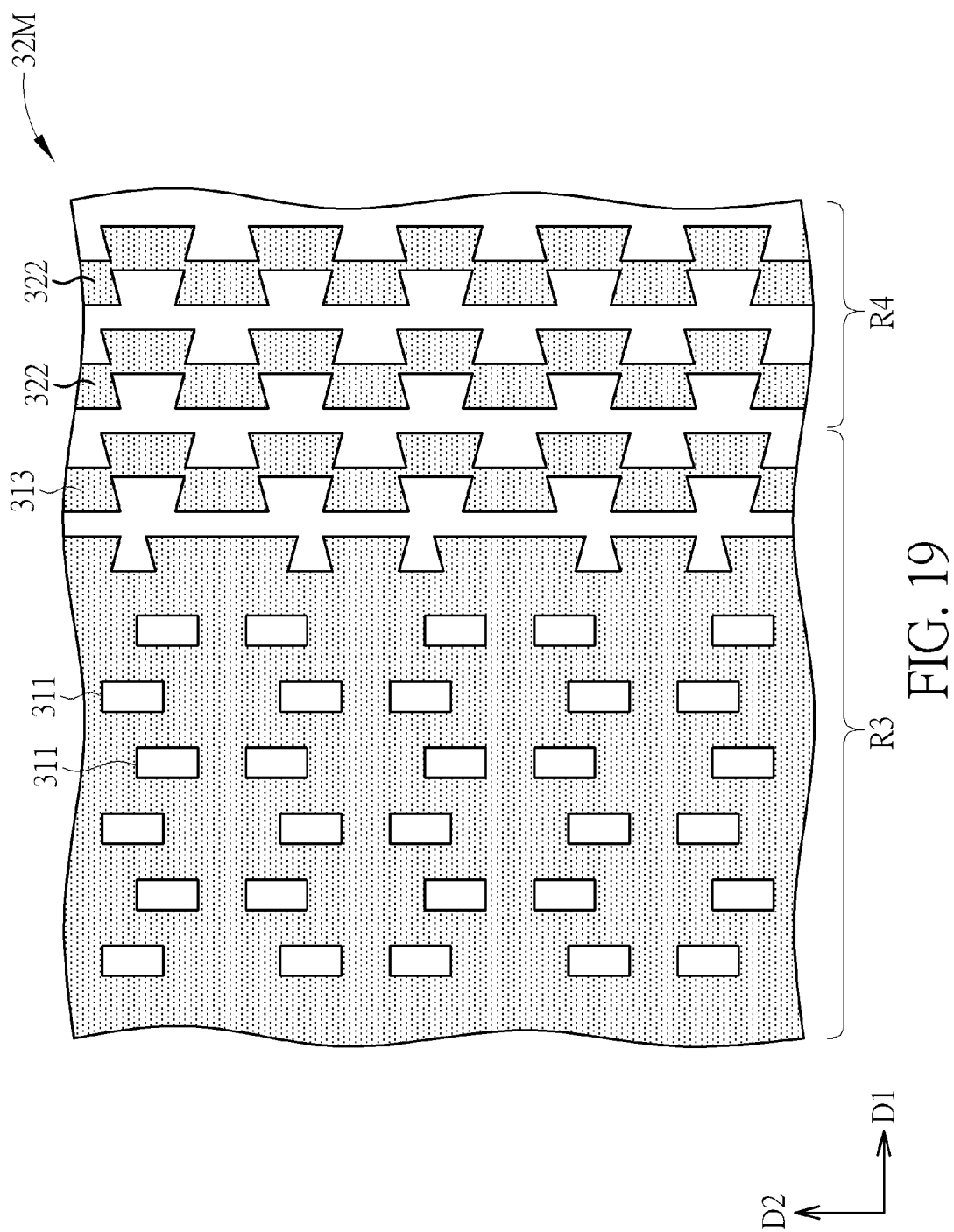
FIG. 19 is a schematic drawing illustrating a fin cut mask according to a fourth embodiment of the present invention.

Please refer to FIG. 18 and FIG. 19. FIG. 18 is a schematic drawing illustrating a fin cut mask 31M according to a third embodiment of the present invention. FIG. 19 is a schematic drawing illustrating a fin cut mask 32M according to a fourth embodiment of the present invention. As shown in FIG. 18, the difference between the fin cut mask 31M in the third embodiment and the fin cut mask in the first embodiment is that the fin cut mask 31M further include a peripheral pattern 313 disposed in the third region R3 and adjacent to the junction of the third region R3 and the fourth region R4, and there is no pattern disposed in the fourth region R4 of the fin cut mask 31M. A shown in FIG. 18 and FIG. 19, the fin cut mask 32M in the fourth embodiment may further include a plurality of compensation patterns 322 disposed in the fourth region R4, and the shape of each of the compensation patterns 322 may be similar to that of the peripheral pattern 313 for improving the etching loading effect near the junction of the first region and the second region in the fin cut process described above.

To summarize the above descriptions, in the method of fabricating a semiconductor structure in the present invention, the compensation pattern in the fin cut mask is located corresponding to the second region where the fin structures are removed by the fin remove process. The compensation pattern may be used to improve the etching loading effect near the juncture of the first region and the second region in the second etching process of the fin cut process. The critical dimension control of the fin structures near the juncture of the first region and the second region may be improved accordingly. Additionally, the fin bump is formed corresponding to the compensation pattern after the fin cut process and the fin remove process. Therefore, the correcting pattern of the corrected layout pattern is generated in accordance with the slot pattern by the optical proximity correction, and the correcting pattern is printable on the semiconductor substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a semiconductor substrate with a first region and a second region defined thereon, wherein the first region is disposed adjoining the second region in a first direction, and the semiconductor substrate comprises:
   a plurality of fin structures disposed in the first region, wherein each of the fin structures is elongated in the first direction;
   a plurality of first recessed fins disposed in the second region, wherein each of the first recessed fins is elongated in the first direction, and a topmost surface of each of the first recessed fins is lower than a topmost surface of each of the fin structures; and a bump disposed in the second region, wherein the bump is disposed between two adjacent first recessed fins in the first direction, and a topmost surface of the bump is higher than the topmost surface of each of the first recessed fins and lower than the topmost surface of each of the fin structures.

2. The semiconductor structure according to claim 1, wherein at least a part of the fin structures are repeatedly disposed in a second direction different from the first direction, and a top surface of a part of the semiconductor substrate disposed between two adjacent fin structures in the second direction is lower than the topmost surface of each of the first recessed fins.

3. The semiconductor structure according to claim 1, wherein the second direction is orthogonal to the first direction.

4. The semiconductor structure according to claim 1, wherein the semiconductor substrate further comprises:
 a second recessed fin disposed in the first region and disposed between two adjacent fin structures in the first direction, wherein a topmost surface of the second recessed fin is lower than the topmost surface of each of the fin structures.

5. The semiconductor structure according to claim 4, wherein the topmost surface of the second recessed fin is higher than the topmost surface of each of the first recessed fins.

6. The semiconductor structure according to claim 4, wherein the topmost surface of the second recessed fin and the topmost surface of the bump are located at the same level.

7. The semiconductor structure according to claim 4, wherein the second recessed fin is directly connected with the two adjacent fin structures in the first direction.

8. The semiconductor structure according to claim 1, wherein the bump is directly connected with the two adjacent first recessed fins in the first direction.

9. The semiconductor structure according to claim 1, wherein at least one of the first recessed fins is disposed between the bump and one of the fin structures in the first direction.

10. The semiconductor structure according to claim 9, wherein the first recessed fin disposed between the bump and the fin structure in the first direction is directly connected with the bump and the fin structure in the first direction.

11. The semiconductor structure according to claim 1, further comprising:
 a shallow trench isolation disposed on the semiconductor substrate, wherein the topmost surface of each of the first recessed fins and the topmost surface of the bump are covered by the shallow trench isolation, and the fin structures protrude above a topmost surface of the shallow trench isolation.

12. The semiconductor structure according to claim 11, wherein the topmost surface of the shallow trench isolation is lower than the topmost surface of each of the fin structures.

* * * * *